United States Patent [19]

Stoehr et al.

[11] Patent Number: 5,532,657
[45] Date of Patent: Jul. 2, 1996

[54] HIGH SPEED COAXIAL CONTACT AND SIGNAL TRANSMISSION ELEMENT

[75] Inventors: Roland Stoehr, Nufringen; Rudolf Kratt, Rottenburg, both of Germany

[73] Assignee: International Business Machines Corporation, Armonk, N.Y.

[21] Appl. No.: 448,221

[22] Filed: May 23, 1995

[51] Int. Cl.$^6$ .................................................. H01P 3/06
[52] U.S. Cl. ...................... 333/243; 333/244; 324/754; 324/762; 174/29; 174/126.2
[58] Field of Search ......................... 333/243, 244; 324/754, 762; 174/28, 29, 102 R, 102 A, 126.2

[56] References Cited

U.S. PATENT DOCUMENTS 2,614,172  10/1952  Greenfield et al. ............... 333/243 X
2,890,263   6/1959  Brandes et al. ........................ 174/29

Primary Examiner—Paul Gensler
Attorney, Agent, or Firm—Douglas W. Cameron

[57] ABSTRACT

Disclosed is a high speed coaxial contact and signal transmission element which comprises an inner conductor element 1, an outer conductor element 6 and a dielectric area 4 between the inner conductor element 1 and the outer conductor element 6. The inner conductor element 1 is a continuous element and consists of a core 2 of hardened conductive material exhibiting good elastic properties surrounded by a metal shell 3. A filament 5 of low dielectric constant material is wrapped around the inner conductor element 1 and fixed on the surface of the inner conductor element 1. The outer conductor element 6 consists of a metal shield. These high speed coaxial contact and signal transmission elements are used for the transmission of high speed electrical signals in high density fashion and for contacting and testing electrical devices with minimal dimensions.

2 Claims, 1 Drawing Sheet

HIGH SPEED COAXIAL CONTACT AND SIGNAL TRANSMISSION ELEMENT

TECHNICAL FIELD

The invention relates to a high speed coaxial contact and signal transmission element. These elements are used for the transmission of high speed electrical signals in high density fashion and for contacting and testing electrical devices.

DESCRIPTION OF THE PRIOR ART

With the increasing miniaturization of electronic components there is a strong demand for adequate contact and signal transmission elements in the high frequency (GHz) range. Coaxial cables suitable for signal transmissions in the GHz range should have a diameter smaller than approximately 0.6 mm and an approximately 50-ohm or 70-ohm characteristic impedance.

A very high speed coaxial cable with a 50-ohm characteristic impedance is disclosed in IBM Technical Disclosure Bulletin Vol. 32, No. 6A, November 1989, p. 173/174. In the construction of this coaxial cable two filaments of low dielectric porous material are spirally wrapped about the signal center conductor in counter-directions and at different wrapping rates. The different wrapping rates cause multiple crossings of the filaments to occur and thus create a stable symmetrical cross-section, in addition, this kind of wrapping guarantees the incorporation of a large fraction of air of low dielectric constant into the cross-section of the coaxial cable.

The forming of a radiation cable by winding at least two conductive tapes around a core having an inner conductor surrounded by a dielectric layer is described in U.S. Pat. No. 4,432,193. Both tape widths and pitch angles can be varied along the cable length to give the desired cable characteristics like aperture shape, size and distribution along the cable length.

GB 1163308 discloses a coaxial cable with a balloon-type helical insulator which is made by forming a tube of plastics material about the inner conductor. After forming and inflating the tube is shaped by winding a single filament tightly around it thereby causing the tube to make contact with the inner conductor along a helical path. The capacity of the cable may be varied by regulating the pitch of the winding of the filament. The filament is removed after the tube has been set.

Known high speed coaxial probes for electrical device testing consist of probe tips that are attached to the coaxial cable. In IBM Technical Disclosure Bulletin Vol. 32, No. 8A, January 1990, p. 133–135 a beryllium-copper tip with the tip end being 25 μm wide is attached to a semi-rigid coaxial cable and brings the signal to the pads on the device to be tested. Often there are used wire or needle probes coupled to a blade as disclosed in U.S. Pat. No. 4,593,243. The needle or wire end is adapted to contact a conductive pad on a device to be tested. EPP Halbleiter July/August 1992, p. 50/51 describes the application of different blades like ceramic or metal blades with test needles and also the use of coaxial cables with needles for testing devices.

All these known coaxial elements thus have interfaces or interruptions between the coaxial cable and the electrical device to be tested and therefore impedance and contact resistance are negatively affected in that it causes problems especially in high frequency applications.

SUMMARY OF THE INVENTION

It is an object of the present invention to provide a high speed coaxial contact and signal transmission element which may simultaneously be used as contact and signal transmission element. It is a further object to provide a high speed coaxial contact and signal transmission element which requires no interface between the high speed coaxial contact element and an electrical device to be tested by said high speed coaxial contact element. Still a further object is to provide a high speed coaxial element which shows very accurate signal transmission results.

These objects are achieved by the invention as claimed. Provided is a high speed coaxial contact and signal transmission element which comprises an inner conductor element, an outer conductor element and a dielectric area between said inner conductor element and said outer conductor element, wherein said inner conductor element is a continuous element and consists of a core of hardened conductive material exhibiting good elastic properties surrounded by a metal shell. A filament of low dielectric constant material is wrapped around said inner conductor element and fixed on the surface of the inner conductor element and said outer conductor element consists of a metal shield.

DESCRIPTION OF THE PREFERRED EMBODIMENT

Figure 1:
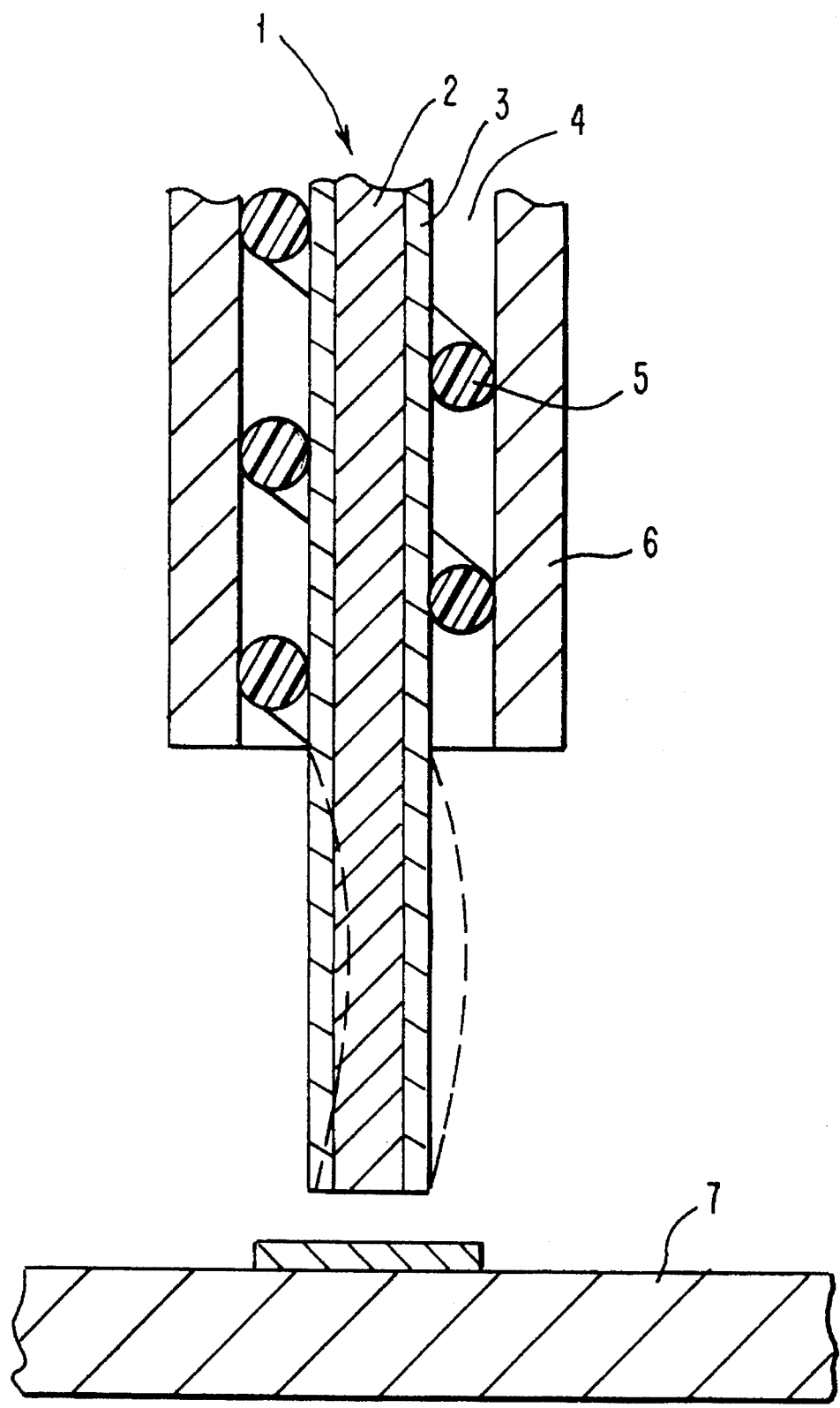
FIG. 1 shows a cross-section of the transmission element of this invention.

Ways of carrying out the invention are described in detail below with reference to a drawing, FIG. 1, showing only one specific embodiment in which the cross-section of a high speed coaxial contact and signal transmission element is shown.

The inner conductor element 1 consists of a core 2 of hardened conductive material, e.g. CuBe2, which also exhibits good elastic properties. The diameter of the core 2 is in the range of smaller than approximately 0.060 mm. This core 2 is surrounded by a metal shell 3 comprising Ag and Cu to further enhance the conductance of the inner conductor element 1. Choosing different materials for the core 2 and the metal shell 3 easily allows defining suitable mechanical as well as electrical properties of the inner conductor element. Hardening of the core 2 material to approximately 1400 N/mm$^2$ or approximately 1600 N/ram$^2$ further enhances its conductance and its tension. The change of the electrical and mechanical properties of the inner conductor element 1 induced by the hardening step provides an inner conductor element which allows using this conductor element as a contact element. Due to its good elastic properties the inner conductor element is flexible as indicated by dashed lines in FIG. 1 and thus may easily contact e.g. the contact pad of a device to be tested.

The inner conductor element thus is a continuous element having no interfaces between the conductor element and a device to be contacted and tested. This is extremely important For high Frequency applications when impedance is important. The core 2 being surrounded by a metal shell 3 offers further advantage especially for high frequency applications being influenced by the skin effect, since signal transmission at high frequencies takes place significantly in the surface area of a conductor.

The outer conductor element 6 consists of a metal shield, the metal preferably comprises Ag and Cu.

Between the inner conductor element 1 and the outer conductor element 6 there is a dielectric area 4. This dielectric area 4 has essential influence on the total diameter of the coaxial element depending on the dielectric constant of the dielectric material chosen. The best dielectric material is air with $\epsilon_r=1$. Realizing a coaxial cable using only air as dielectric material is however not manufacturable. As shown in FIG. 1 a filament 5 of low dielectric constant material is wrapped around the inner conductor element 1 and fixed on the surface of the inner conductor 1. The fixing of the filament 5 is important to avoid relative motions between the filament 5 and the inner conductor 1. Such motions could cause friction inducing electrostatic charging processes which could have impact on the signal transmission behavior of the coaxial element. In a preferred embodiment the filament is spirally wrapped around the inner conductor element. The filament material chosen should have a very small dielectric constant. Suitable materials are e.g. polyimides, polytetrafluoroethylene (PTFE) and mineral fibers. The filament is preferably a monofilament of dielectric material, but it is also possible to wrap two or more fibers around the inner conductor element. By regulating the pitch of the winding of the filament the electrical properties of the coaxial element may be changed, especially the impedance of the coaxial contact and signal transmission element. Changing the pitch of the winding changes the $\epsilon_r$-ratio of air and filament in that with a reduced pitch the portion of air is reduced too.

The high speed coaxial contact and signal transmission element described above has a total diameter of smaller than approximately 0.6 mm and an impedance of approximately 50 ohm or approximately 70 ohm.

Thus it offers a broad spectrum of various applications for high frequency signal transmission and for contacting electronic devices with minimal dimensions, e.g., for testing with an array as disclosed in EP-A-0 283 545.

Having thus described our invention, what we claim as new and desire to secure by Letters Patents is:

1. A high speed coaxial contact and signal transmission element comprising:

a. an inner conductor element;

b. an outer conductor element comprising a metal shield;

c. a dielectric area between said inner conductor element and said outer conductor element, where said inner conductor element is a continuous element with a core of hardened conductive material exhibiting good elastic properties surrounded by a metal shell, said core having a hardness in the range of approximately 1400 N/MM$^2$ to approximately 1600 N/MM$^2$, and said core material being CuBe$_2$; and d. a filament of low dielectric constant material wrapped around said inner conductor element and fixed on the surface of said inner conductor element.

2. A signal transmission element as recited in claim 1, wherein said inner conductor element extends beyond said outer conductor element, said dielectric area and said filament where said inner conductor element can directly contact a device to be tested by said transmission element.

* * * * *